United States Patent [19]

Kinkel

[11] Patent Number: 4,855,689
[45] Date of Patent: Aug. 8, 1989

[54] PHASE LOCK LOOP WITH SWITCHABLE FILTER FOR ACQUISITION AND TRACKING MODES

[75] Inventor: John F. Kinkel, Irvine, Calif.

[73] Assignee: Hughes Aircraft Company, Los Angeles, Calif.

[21] Appl. No.: 14,580

[22] Filed: Feb. 13, 1987

[51] Int. Cl.⁴ .............................................. H03L 7/10
[52] U.S. Cl. .......................................... 331/17; 331/4; 331/25; 331/DIG. 2; 329/122; 375/120
[58] Field of Search ................ 331/17, 4, 25, DIG. 2; 375/120; 329/122; 455/260

[56] References Cited

U.S. PATENT DOCUMENTS

| | | | |
|---|---|---|---|
| 3,346,814 | 10/1967 | Haggai | 329/122 |
| 3,421,105 | 1/1969 | Taylor | 331/17 X |
| 3,551,829 | 12/1970 | Haggai | 329/122 |
| 3,740,671 | 6/1973 | Crow et al. | 331/17 X |
| 3,886,312 | 5/1975 | Dorren . | |
| 3,983,488 | 9/1976 | Bush et al. | 329/122 X |
| 4,007,429 | 2/1977 | Cadalora et al. | 331/17 |
| 4,580,107 | 4/1986 | Caldwell et al. | 331/10 |

Primary Examiner—Siegfried H. Grimm
Attorney, Agent, or Firm—A. W. Karambelas

[57] ABSTRACT

A phase lock loop for use in carrier acquisition employing a predetection filter and a loop filter switchable between a constant phase margin and second order characteristic. In the acquisition mode, the constant phase margin characteristic is employed to acquire the carrier and the second order characteristic is thereafter employed to track the carrier. The second order characteristic retains only the pole at the origin and the lowest frequency zero of the constant phase margin characteristic. The filter parameters are selected to minimize the mean square deviation of a phase margin expression which includes contributions from the predetection filter pole and from positive poles generated by the loop's voltage controlled oscillator. The loop filter is further provided with gain coefficients selected to maximize the probability of carrier acquistion at a plurality of frequencies and carrier to noise density ratios.

14 Claims, 2 Drawing Sheets

PHASE LOCK LOOP WITH SWITCHABLE FILTER FOR ACQUISITION AND TRACKING MODES

This invention was made with the Government support under contract number LC720-AN01.

TECHNICAL FIELD

The subject invention relates to the technical field of communications.

BACKGROUND OF THE INVENTION

1. Field of the Invention

The subject invention relates generally to the communications arts and, more particularly, to an improved phase lock loop for use in receiving signals of widely varying level and subject to Doppler shift.

2. Description of Related Art

Space flight requirements have inspired intensive application of phase lock methods. As reported in Gardner, *Phase Lock Techniques,* 2d Ed., Willey & Sons (1979), space use of phase lock begin with the launching of the first American artificial satellites. These vehicles carried low-power (10 mW) CW transmitters and the received signals were correspondingly weak. Because of Doppler shift and drift of the transmitting oscillator, there was considerable uncertainty about the exact frequency of the received signal. At the 108 MHz frequency originally used, the Doppler shift could range over a ±3-kHz interval.

With an ordinary, fixed-tuned receiver, bandwidth would therefore have to be at least 6 kHz, if not more. However, the signal itself occupied a very narrow spectrum and could be contained in a bandwidth of approximately 6 Hz.

Since noise power in the receiver is directly proportional to bandwidth, a noise penalty of 1000 times (30 dB) would have had to have been accepted if then-conventional techniques were used. The noise penalty has become even more severe. For example, with the movement of transmission frequencies to S-band, the Doppler shift range increased to approximately ±75 kHz while receivers with bandwidths as small as 3 Hz have been achieved. The noise penalty in such case is about 47 dB.

Noise can be rejected by a narrow band filter, but if the frequency of the filter is fixed, the signal may not be within the passband. For a narrow bandwidth filter to be usable it must be capable of tracking the signal. A phase locked loop is capable of providing both the narrow bandwidth and the tracking that are needed. Moreover, extremely narrow bandwidths are conveniently obtained with phase locked loops. Hence, narrow band, phase locked, tracking receivers have come into use to avoid severe noise penalties and to acquire drifting signals.

A phase lock loop (PLL) contains three basic components: a phase detector, a loop filter, and a voltage-controlled oscillator (VCO), whose frequency is controlled by an external voltage.

The phase detector compares the phase of a periodic input signal against the phase of the VCO. The difference voltage output of the phase detector is a measure of the phase difference between its two inputs. The difference voltage is then filtered by the loop filter and applied to the VCO. Application of the control voltage to the VCO changes the frequency in a direction that reduces the phase difference between the input signal and the local oscillator.

The most well-known phase lock loop is the second order loop, so-called because of the second order transfer function provided by its loop filter. A well-known second order loop filter configuration employs an operational amplifier having an input resistance and a feedback loop containing a second resistance in series with a capacitance.

A second variety of phase lock loop, the Haggai loop, employs a loop filter having a constant phase network in the operational amplifier feedback loop. In this design, the loop filter provides a nearly constant phase margin, and hence nearly constant per unit damping over a wide range of open loop gains. For low carrier to noise density ratios C/N, the carrier is buried in noise and is of unknown amplitude prior to PLL acquisition. Since the open loop gain of the PLL is proportional to carrier level, the PLL acquisition loop dynamics will change substantially with the unknown carrier level. The important advantage of the Haggai loop PLL over other designs such as the second order loop is that the per unit damping of the closed loop dynamics is nearly constant over a wide range of unknown input carrier levels. This feature greatly enhances the performance of the Haggai loop in acquiring an unknown Doppler shifted signal of widely varying power. At low frequencies, the Haggai loop reverts to a second order loop so that the steady state phase error is zero.

While the Haggai loop has made a significant contribution to PLL technology, its use in certain applications has been found to have some disadvantages. For example, the Haggai loop has exhibited a probability of loss of lock on the order of 30%, in switching from an acquisition mode to a narrow band track mode. This phenomenon can be explained heuristically by considering that at the instant of switching from a wide acquisition bandwidth to a narrow tracking bandwidth the frequency error may easily exceed the pull-in bandwidth of the tracking loop. The Haggai loop has further exhibited a propensity to false lock at high signal levels.

It would therefore be an advancement in the art to provide a receiver using PLL technology which includes the advantages of the Haggai loop but which does not lose lock when switching from the acquisition mode to the track mode and which does not false lock at high signal levels.

SUMMARY OF THE INVENTION

It is therefore an object of the invention to provide an improved phase lock loop;

It is another object of the invention to provide a phase lock loop which exhibits the acquisition performance of the Haggai loop, while avoiding the loss of lock in switching to a narrow band tracking mode.

It is another object of the invention to provide such a phase lock loop which avoids false lock at high signal levels.

It is still another object of the invention to improve the acquisition performance of the Haggi loop.

These and other objects and advantages are achieved according to the invention by a phase lock loop employing a constant phase margin loop filter in the acquisition mode and a loop filter retaining only the pole at the origin and the lowest order zero of the constant phase margin loop filter in the tracking mode, resulting in a second order tracking loop. According to another feature of the invention, the loop filter design incorporates a predetection filter pole. To achieve an additional improvement, the acquisition mode loop gain is made a function of sweep rate, which eliminates false locking at high signal levels.

The just summarized inventive aspects of the disclosure produce several notable improvements in performance. Retaining only the pole at the origin and the lowest frequency zero has been found to eliminate loss of lock in switching from the acquisition mode to the tracking mode. With this change, no acquisition-to-tracking transfer failures were observed in over 50,000 trials. There is no loss in system performance by using a conventional second order PLL in the tracking mode since in this mode the carrier level, and hence the loop gain of the PLL, is well controlled by means of synchronous AGC.

Incorporating the pole introduced by the predetection filter results in the ability of the loop to maintain a 45 degree phase margin over a much larger range of open loop gains, permitting good acquisition dynamics to be maintained over a wider range of carrier levels. Thus, the major advantage of the Haggai loop is enhanced by this change.

Varying the acquisition mode loop gain with sweep rate avoids the false lock problem which occurs with a fixed loop gain under strong carrier conditions. As a secondary benefit, optimal operation is achieved for each sweep rate and C/N combination.

BRIEF DESCRIPTION OF THE DRAWINGS

The just summarized invention will now be described in conjunction with the drawings in which.

DETAILED DESCRIPTION OF THE PREFERRED EMBODIMENT

The preferred embodiment will now be described, beginning with a discussion of a system wherein the preferred embodiment finds application. This discussion will particularly illustrate the use and advantages of the preferred embodiment, as well as provide background for a detailed discussion of the design of a phase lock loop according to the preferred embodiment.

Figure 1:
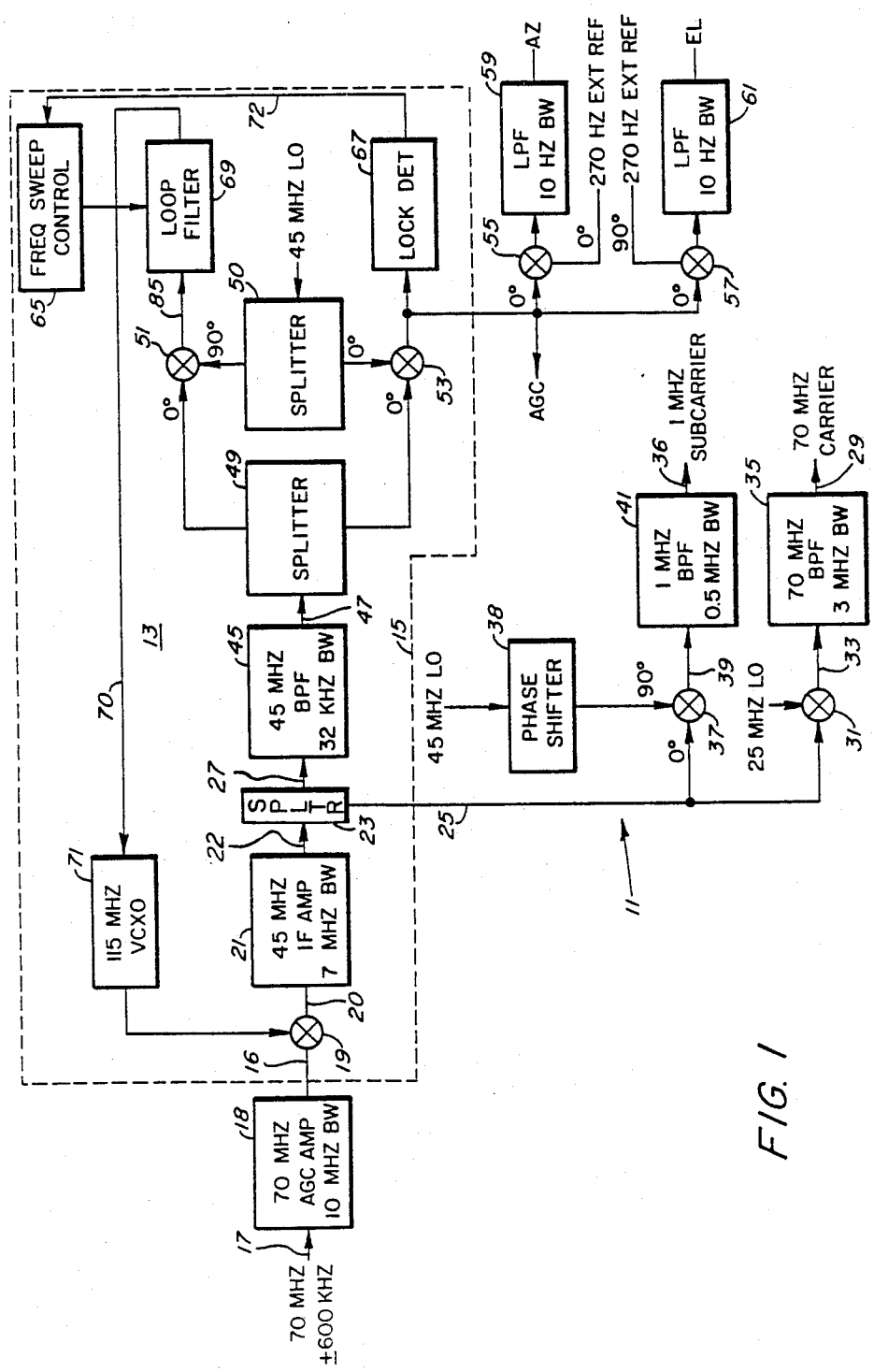
FIG. 1 is a circuit block diagram of a receiver wherein the preferred embodiment finds application.

FIG. 1 illustrates a demodulator 11 employing a phase lock loop 13 according to the preferred embodiment. The PLL 13 is encompassed within a dashed line 15. The demodulator 11 is designed to accept an input carrier of 70 MHz±600 kHz which is modulated as follows:

1. Phase modulation with a 1 Mb/S PN sequence and a modulation index of 0.2 radians.
2. Phase modulation with a 1 MHz subcarrier and a modulation index of 1.2. The 1 MHz subcarrier is biphase modulated with digital data having data rates of either 1 kb/S or 128 kb/S.
3. Amplitude modulation with two biphase square wave signals having a frequency of 270 Hz. The two modulating signals have a quadrature (90°) phase relationship. The modulation index of each signal is independent of the other and may have any value not exceeding 30%.

The demodulator 11 provides the following outputs:
1. An output carrier of (almost) precisely 70 MHz with all modulation intact.

2. A subcarrier of 1 MHz with the biphase binary data modulation.
3. The DC (low frequency) outputs corresponding to coherent detection of the square wave amplitude modulating signals.

The basic design approach used to meet the operating requirements is based on the use of the phase lock loop 13 for removal of the frequency uncertainty of the input carrier and for synchronous detection recovery of the 1 MHz subcarrier and AM signals.

In FIG. 1, the incoming 70 MHz carrier on line 17 is fed to a 70 MHz AGC amplifier 18 having a 10 MHz bandwidth. The output 16 of the ACG amplifier 18 is converted to a 45 MHz stabilized carrier by the phase lock loop 13. The stabilized carrier appears at the output 20 of a mixer 19 and is fed to a 45 MHz IF amp 21 having a bandwidth of 7 MHz. The output 22 of the IF amp 21 is fed to a splitter 23 which provides outputs on two lines 25, 27.

The 70 MHz output carrier on line 29 is obtained by mixing the 45 MHz stabilized carrier on the first splitter output 25 with a 25 MHz local oscillator (LO) at a mixer 31 and filtering the output 33 of the mixer 31 using a 70 MHz bandpass filter 35 having a 3 MHz bandwidth. The 1 MHz subcarrier is recovered by quadrature mixing of the 45 MHz carrier and a 45 MHz LO at a mixer 37 after phase shifting the 45 MHz LO at a phase shifter 38. The output 39 of the mixer 37 is then filtered with a 1 MHz bandpass filter 41 having a 0.5 MHz bandwidth to obtain the 1 MHz subcarrier at an output 36 of the filter 41.

The second output 27 of the splitter 23 is fed to a predetection filter 45, which is a 45 MHz-centered bandpass filter having a 32 KHz bandwidth. The output 47 of the filter 45 is fed to a second splitter 49, which supplies a first mixer 51 and a second mixer 53. The 270 Hz AM modulation is recovered by in-phase mixing of the 45 MHz carrier and the 45 MHz LO at the second mixer 53. Coherent demodulation of the 270 Hz signals using externally provided in-phase and quadrature 270 Hz LO frequencies and respective mixers 55, 57 and low pass filters 59, 61 yields the dc (low frequency) signals. The 25 and 45 MHz LO frequencies are generated by the two PLL synthesizers (not shown) from a stable 5 MHz crystal oscillator.

The PLL 13 includes the phase detector 19, a loop filter 69, a VCO 71 receiving the output 70 of the loop filter 69, and a frequency sweep control circuit 65 which inputs switch selectable sweep rates and adjustable frequency ranges to the loop filter 69 for acquiring the carrier. Noise saturation of the PLL phase detector 19 is avoided by the use of the narrow band (32 kHz) predetection filter 45 in the signal path between the output of the phase detector 19 and the input 85 to the loop filter 69. A lock detection circuit 67 provides an indication that phase lock (carrier acquisition) has been achieved.

Improved performance is provided by different modes of operation of the loop filter 69 for acquisition and tracking. The general operation of the loop filter 69 in the context of FIG. 1 will now be discussed, followed by a detailed discussion of the loop filter circuit elements in connection with FIG. 2. Selection of a particular set of resistor and capacitor (RC) elements for the loop filter is thereafter discussed in connection with a detailed mathematical analysis and design procedure. Thereafter, additional mathematical analysis is set forth to derive gain coefficients selected to maximize the probability of carrier acquisition.

In the acquisition mode, the PLL 13 is a constant phase margin design. In tis design, a pole/zero array in the loop filter 69 provides a nearly constant phase margin, and hence nearly constant per unit damping over a wide range of open loop gains. For low carrier to noise density ratios C/N, the carrier is buried in noise and is of unknown amplitude prior to acquisition. Since the open loop gain of the PLL 13 is proportional to carrier level, the PLL acquisition loop dynamics will change substantially with the unknown carrier level. The important advantage of the constant phase margin design is that the per unit damping of the closed loop dynamics is nearly constant over a wide range of unknown input carrier levels. This feature greatly enhances acquisition performance.

The PLL 13 acquires carrier by performing a time linear frequency search over an adjustable frequency range provided by the frequency sweep control circuit 65. Frequency sweep is achieved by sweep current injection into an integrating loop filter amplifier 75 at a terminal 115 (FIG. 2) of the loop filter 69. The frequency versus time profile of the sweep signal is a saw tooth of controlled positive slope with a very fast retrace (high negative slope). An important advantage of this design, in addition to simplicity, is that the frequency search is automatically terminated by acquisition of phase lock. Following acquisition, the sweep injection signal results in a steady state phase error of $\pi/8$ radians under design center conditions, which, according to analysis, results in maximum probability of acquisition for the preferred embodiment. Subsequent removal of the sweep injection reduces the steady state phase error to zero.

In the preferred embodiment, both sweep rate and acquisition loop gain are selected via a common switch control. In this manner, false lock is avoided by providing a loop gain appropriate to the sweep rate such that the steady state tracking error angle for the spurious lock exceeds the hold lock capability of the loop.

Lock detection is achieved by the lock detector 67, which performs in-phase coherent detection of the 45 MHz carrier using the 45 MHz LO. A comparative threshold of 50% of the level corresponding to a carrier-to-noise density ratio (C/N) of 36 dB.Hz is used. Following lock detection, this threshold is reduced to 25% by hysteresis in the comparator to avoid failure of the lock indication at reduced carrier levels. A single pore RC filter, in conjunction with the narrow band (32 kHz) predetection filter 45, provides a lock detection response time of less than 25 miliseconds (ms) with an extremely low false alarm rate. Actuation of the lock detection circuit 67 removes the sweep injection by the sweep control 65 so as to reduce the steady state tracking error angle to zero following lock recognition. This is indicated in FIG. 1 by the schematic input 72 from the lock detection circuit 67 to the sweep control 65.

Figure 2:
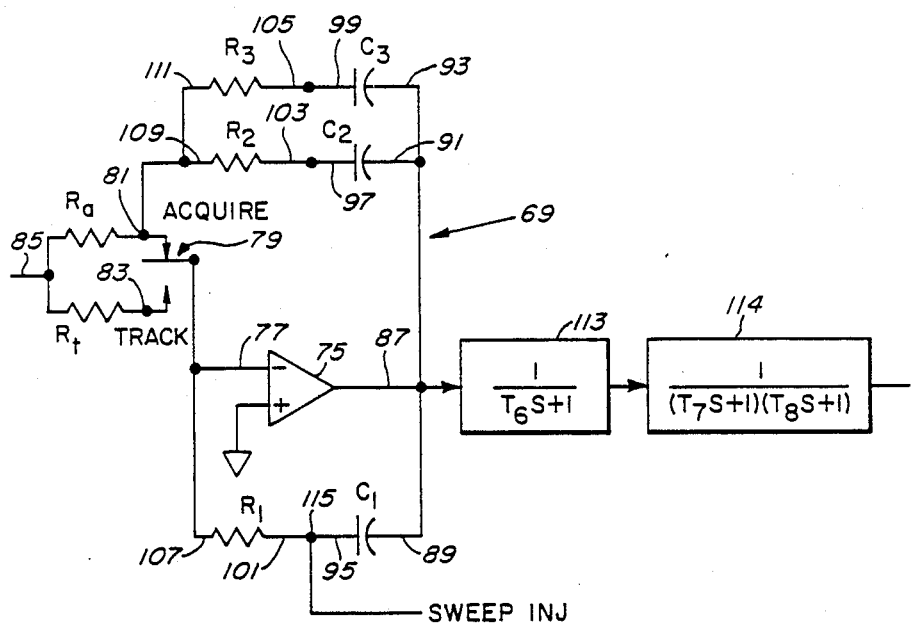
FIG. 2 is a circuit schematic illustrating the loop filter of the preferred embodiment.

Following recognition of lock, an external command can switch the PLL 13 from the acquisition mode to the track mode via a switch 79 (FIG. 2). To avoid loss of lock in switching from the acquisition to the track mode, the PLL configuration used for the track mode is a conventional second order error integrating loop which retains only the pole at the origin and the lowest frequency zero of the acquisition loop pole/zero array. This approach results in extremely low probability of loss of lock in switching from the acquisition to the track mode.

The functions of the automatic gain control (AGC) 18 are to control the signal-plus-noise level applied to the phase lock loop 13 in the acquisition mode and to control the carrier level in the track mode. An additional function of the AGC 18 is to provide a measure of carrier level following recognition of lock by the PLL 13.

Prior to recognition of lock by the PLL, the AGC 18 operates with asynchronous detection to provide a constant signal plus noise level in a 10 MHz bandwidth. Thus, in the acquisition mode, the carrier level varies directly with the carrier to noise density ratio (C/N) for C/N less than about 60 dB.Hz and is unknown prior to recognition of lock. Following recognition of lock by the PLL 13, the AGC 18 operates with synchronous detection provided by the PLL 13 to provide a constant carrier level to the PLL 13.

The AGC 18 employs a control loop including a linearizer (linear attenuation of dB versus control volts) so as to provide constant dynamic performance over a wide range of input carrier levels. A single pole error integrating loop filter is preferred to provide a very fast response time with sufficiently small noise bandwidth to minimize noise induced gain perturbations. The nose bandwidth of the AGC 18 is further reduced in the track mode from that in the acquisition mode.

A very important feature of the AGC 18 is that synchronous carrier detection control is not applied until after recognition of lock by the PLL 13. In this way, the acquisition dynamics of the PLL 13 are fully decoupled from the AGC dynamics. Another important feature is that the single pole loop dynamics of the AGC 18 provides a monotonic time response to a step function of error. Thus, in switching from the asynchronous detection acquisition mode to the synchronous detection post acquisition mode, no undershoot of carrier level can occur which could result in loss of lock.

The loop filter 69 of the preferred embodiment is illustrated in detail in FIG. 2. The filter is illustrated as an active filter employing an operational amplifier 75. The inverting input 77 of the operational amplifier 75 is connected to a switch 79 which switches between a first position 81 and a second position 83. First, second, and third capacitors $C_1$, $C_2$, $C_3$, each have a respective first terminal 89, 91, 93 connected to the output 87 of the operational amplifier 75 and their respective second terminals 95, 97, 99 connected to the first terminals 101, 103, 105 of respective resistors $R_1$, $R_2$, $R_3$. The second terminals 109, 111 of the second and third resistors $R_2$, $R_3$ are connected to the first position 81 of the switch 79, while the second terminal 107 of the first resistor $R_1$ is connected directly to the inverting input 77 of the operational amplifier 75.

Switching of the switch 79 selects the input resistance of the loop filter 69. In the first position 81, a resistor $R_a$ is connected between the inverting input 77 and the loop filter input 85. In the second position 83, a resistor $R_t$ is connected between the inverting input 77 and the loop filter input 85.

Switching of the switch 79 further determines the circuitry in the feedback path of the operational amplifier 75. In the first position 81, three series resistor-capacitor combinations are connected in the path. In the second position 81 of the switch, only the series combination of the first resistor $R_1$ and the first capacitor $C_1$ are effectively in the feedback path of the operational amplifier 75. Thus, the loop is switchable by means of switch 79 between a constant phase margin loop (first position) and a second order loop having a pole and zero in common with the constant phase margin network.

FIG. 2 illustrates, in block 113 and block 114, respectively, the presence of a pole ($T_6s+1$) introduced by the predetection filter 45 and presence of a pair of parasitic poles ($T_7s+1$) ($T_8s+1$) introduced by the VCO 71.

Figure 3:
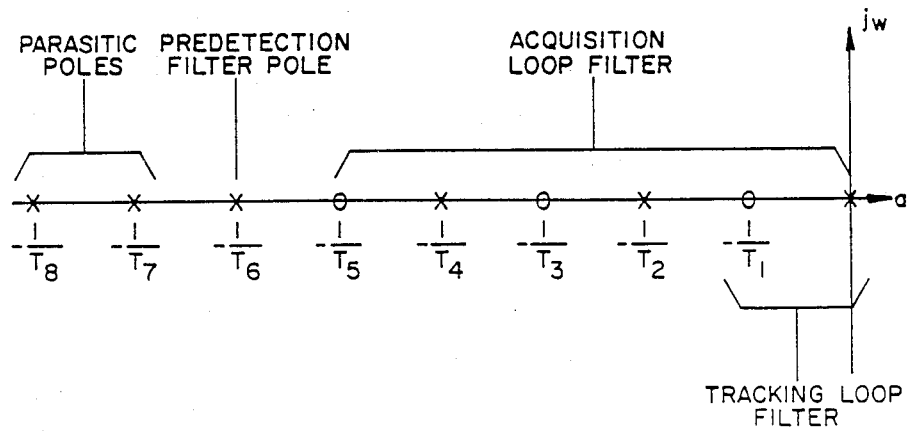
FIG. 3 is an s-plane plot of the pole/zero array of the preferred embodiment.

It further shows the sweep injection point 115, discussed above. FIG. 3 illustrates the desired pole/zero array for the preferred embodiment. The acquisition loop pole/zero array of FIG. 3 accommodates the pole introduced by the predetection filter 45 and the parasitic poles introduced by the VCO 71 to provide a constant phase margin over a wide range of open loop gains.

The design procedure used for the PLL 13 is outlined as follows, prior to a detailed mathematical treatment thereof. First, the track mode design is accomplished in order to establish the loop gain and the s-plane position of the zero in the second order loop. The loop gain and the zero location in the s-plane are uniquely determined by the noise bandwidth and per unit damping of the second order tracking loop. The zero location must be determined prior to design of the acquisition loop since the tracking loop zero becomes the lowest frequency zero in the acquisition loop. The tracking loop requirements of the illustrative embodiment are: noise bandwidth B=200 Hz, per unit damping=0.85, C/N=36 dB.Hz.

Second, the acquisition loop is designed using the tracking loop zero as the lowest frequency acquisition loop zero and the predetection filter pole as the highest frequency pole in the acquisition loop. The higher frequency parasitic poles are also accounted for in the design.

The RC elements which determine the pole and zero locations between the tracking loop zero and the predetection filter pole are determined by nonlinear programming so as to minimize the mean square phase margin deviation from $\pi/4$ radians over a specified frequency range. The frequency range used in this case is from twice the tracking loop zero to one-half the predetection filter pole. Higher frequency parasitic poles are accounted for in the calculation of phase. The peak ripple in phase margin deviation from $\pi/4$ radians is determined by the number of RC elements utilized (number of interlaced poles and zeros), becoming larger with fewer elements, smaller with more elements. Two RC networks $R_2C_2$ and $R_3C_3$ in addition to the tracking loop RC network $R_1$, $C_1$ were found to give satisfactory results in the present case.

Having determined the acquisition loop pole and zero locations, the loop gains are determined for each sweep rate (f) and carrier-to-noise density (C/N) combination so as to maximize the probability of acquisition. It has been shown that the probability of acquisition is maximized by utilizing a loop gain coefficient which results in a steady state tracking error of $\pi/8$ radians.

The lock detector 67 incorporates hysteresis so as to reduce the threshold from 50% (C/N=36 dB.Hz) prior to lock recognition to 25% (C/N=36 dB.Hz) following lock recognition. This threshold reduction, achieved through hysteresis, prevents failure of the lock detection circuit for post lock C/N values several dB less than 36 dB.Hz. Thus as C/N is reduced actual loss of lock in the PLL 13 is observed to occur prior to failure of the lock recognition circuit.

A detailed analysis illustrating selection of circuit elements of an illustrative embodiment will now be set forth. It will be understood that this analysis is provided as additional instruction in the manner of making and using the invention and that the invention is not limited to the particular design hereafter described.

The linearized second order tracking loop can be described by the transfer function $$F(s) = \frac{GH}{1 + GH} \tag{1}$$

where $$GH = \frac{K(Ts + 1)}{s^2} \tag{2}$$

Combining eq's (1) and (2) results in $$F(s) = \frac{2\zeta\beta_0^{-1}s + 1}{\beta_0^{-2}s^2 + 2\zeta\beta_0^{-1}s + 1} \tag{3}$$

where $$\beta_o = K^{\frac{1}{2}} \tag{4}$$

$$\zeta = \tfrac{1}{2}K^{\frac{1}{2}}2\,T \tag{5}$$

Thus, if $\zeta$ and $\beta_o$ are known, we find:

$$K = \beta_o^2 \tag{4a}$$

$$T = 2\zeta/\beta_o \tag{6}$$

Since the per unit damping $\zeta$ is specified, it remains only to determine the undamped natural frequency $\beta_o$ in terms of the specified noise bandwidth.

The single sided noise bandwidth is found as $$B = \frac{1}{2} \cdot \frac{1}{2\pi} \int_{-\infty}^{\infty} S(\omega)\,d\omega \tag{7}$$

where the spectrum $S(\omega)$ corresponding to $F(j\omega)$ may be found as $$S(\omega) = F(j\omega) \cdot F(-j\omega) \tag{8}$$

Applying Cauchy's residue theorem to the integral in eq (7) results in $$B = \frac{1}{2} \cdot \frac{1}{2\pi} 2\pi j \sum_{i \in I} K_i \tag{9}$$

where
$K_i$ = residue of $i^{th}$ pole of $S(\omega)$
$I$ = set of poles in upper half $\omega$-plane For the spectrum corresponding to eq's (3) and (8), we find the upper half S-plane poles and corresponding residues to be $$\omega_1 = -\beta + j\alpha \tag{10}$$

$$\omega_2 = \beta + j\alpha \tag{11}$$

$$K_1 = \frac{\beta_0^4 + 4\alpha^2(\beta + j\alpha)^2}{2\beta \cdot 2(\beta + j\alpha) \cdot 2j\alpha} \tag{12}$$

$$K_2 = \frac{\beta_0^4 + 4\alpha^2(-\beta + j\alpha)^2}{(-2\beta) \cdot 2j\alpha \cdot 2(-\beta + j\alpha)} \tag{13}$$

where $$\alpha = \zeta\beta_0 \tag{14}$$

$$\beta = (\beta_0^2 - \alpha^2)^{\frac{1}{2}}$$

Combining (9), (12), and (13) and making use of eq's (14) and (15) gives $$B = \frac{1}{2}\left(\zeta + \frac{1}{4\zeta}\right)\beta_0 \tag{16}$$

For the present application, the following parameters are specified:

$\zeta = 0.85$ $B = 200$ Hz

Making use of eq's (4), (6), (16), (17), and (18) gives $$f_0 = \frac{\beta_0}{2\pi} = 55.6 \, H_z$$

$$f_1 = \frac{1}{2\pi T} = 32.7 \, H_z$$

The loop gain coefficient is found from eq's (4a), (16), (17), and (18) as $$K = 1.22 \times 10^5 \, sec^{-2}$$

Since $$K = K_\phi K_I K_o \tag{17}$$

we find the tracking loop integrator gain coefficient $K_I$ for $$K_\phi = .07 \, V/rad$$

$$K_0 = 2\pi \times \frac{14}{15} \times 82 \times 10^3 \, rad.sec^{-1}/volt$$

$$K_I = 3.63 \, sec^{-1}$$

$$C = 1.0 \, \mu f, \, R_I = 275K$$

$$R_1 = \frac{T}{C} = 4.8625 \times 10^3 \Omega$$

The acquisition loop filter is shown in FIG. 2. The corresponding open loop pole/zero array is shown in FIG. 3. Referring to FIGS. 2 and 3, the lowest frequency zero, $\omega_1 = -1/T_1$ has been determined by the requirements for the tracking filter as described in the preceding section. The pole at $\omega_6 = 1/T_6$ is determined by the predetection filter 45. The parasitic poles at $\omega_7 = 1/T_7$ and $\omega_8 = 1/T_8$ are introduced by the VCXO control port.

The problem is to determine suitable values for $T_2$, $T_3$, $T_4$, and $T_5$, or alternatively, to determine values for $R_2$, $R_3$, $C_2$ and $C_3$ in terms of $R_1$ and $C_1$. The criterion used for parameter determination is to minimize the mean square deviation of phase margin from the desired value of $\pi/4$ radians over a selected frequency region.

This is a problem in nonlinear programming for which standard techniques are available.

Referring to FIG. 2, we may write that $$G_1 = \frac{Z}{R_i} \tag{18}$$

where $$Z = \left[\left(R_1 + \frac{1}{j\omega c_1}\right)^{-1} + \left(R_2 + \frac{1}{j\omega c_2}\right)^{-1} + \left(R_3 + \frac{1}{j\omega c_3}\right)^{-1}\right]^{-1} \tag{19}$$

and combining (18) and (19) gives $$G_1(j\omega) = \frac{1}{j\Omega} \frac{1}{D_R + jD_I} \tag{25}$$

where $$D_R = \frac{1}{1 + \Omega^2} + \frac{x_2}{1 + (\Omega x_1 x_2)^2} + \frac{x_4}{1 + (\Omega x_3 x_4)^2} \tag{26}$$

$$D_I = -\Omega\left[\frac{1}{1 + \Omega^2} + \frac{x_1 x_2^2}{1 + (\Omega x_1 x_2)^2} + \frac{x_3 x_4^2}{1 + (\Omega x_3 x_4)^2}\right] \tag{27}$$

Thus, the phase margin contribution from $G_1(j\omega)$ is $$\phi = \tan^{-1}\frac{-D_I}{D_R} \tag{28}$$

Defining $$A_1 = \frac{T_6}{T_1}, \, A_2 = \frac{T_7}{T_1}, \, A_3 = \frac{T_8}{T_1} \tag{29}$$

we can write the phase margin including all contributions as $$\phi = \tan^{-1}\frac{-D_I}{D_R} - \tan^{-1}A_1\Omega - \tan^{-1}A_2\Omega - \tan^{-1}A_3\Omega \tag{30}$$

Since we wish to minimize the $l_2$ norm of $(\phi - \pi/4)$ we can write the nonlinear programming problem as $$\min f(x) = \sum_{k=1}^{K}\left[\phi(\Omega_k) - \frac{\pi}{4}\right]^2 \tag{31}$$

subject to $x \geq 0$ (32)

We select the set $\{\Omega_K\}$ for equal spacing on a logarithmic scale and ranging from 2 to $\frac{1}{2}A_1^{-1}$.

For the present case $A_1 = 2.1164 \times 10^{-3}$ $A_2 = 3.8426 \times 10^{-4}$ $A_3 = 1.4765 \times 10^{-4}$ Using a somewhat arbitrarily selected value of $K = 22$ we can write $$\Omega_K = 2 \times 10^{(k-1)/10}$$

Since we an expect to find only a local minimum solution, it is important to select suitable initial values. Based on computer simulations, the following initial values were selected:

$$x_1 = 0.5$$

$$x_2 = 0.15$$

$$x_3 = 0.15$$

$$x_4 = 0.062$$

A relatively old pattern search algorithm in the IBM 470 Scilib converged to a solution. Minor improvement using a Newton-Raphson algorithm was then possible using the pattern search solution as the initial state vector.

The pattern search solution to the nonlinear programming problem was $$X_1 = 0.55988$$

$$X_2 = 0.157244$$

$$X_3 = 0.1404188$$

$$X_4 = 0.08214569$$

$$f(x) = 10^{-2}$$

The improved result using the Newton-Raphson algorithm with the above starting point was $$X_1 = 0.593255$$

$$X_2 = 0.15582112$$

$$X_3 = 0.13905006$$

$$X_4 = 0.08528825$$

$$f(x) = 0.97 \times 10^{-2}$$

Comparison of the pattern search and Newton-Raphson results shows that the minimum is quite broad so that the exact values of the filter network elements are not crucial. The root mean square phase error corresponding to the solution found is 1.2°.

Selecting $C_1$ as 1.0 μf and rounding all other values to the nearest standard values gives from eq's (21)-(24)

$$C_1 = 1.0 \ \mu f$$

$$R_1 = 4.7 k\Omega$$

$$C_2 = 0.15 \ \mu f$$

$$R_2 = 2.7 k\Omega$$

$$C_3 = 0.082 \ \mu f$$

$$R_3 = 680 \Omega$$

The next step is to determine the loop gains corresponding to each sweep rate which will result in the optimal steady-state tracking angle $\theta_e$ in order to maximize the probability of acquisition.

The steady state tracking error is given by $$\theta_e = \frac{2\pi f}{K} \tag{33}$$

where
 f = acquisition sweep rate
 K = acquisition loop gain coefficient
Since the optimal steady state tracking error is $$\theta_e = \frac{\pi}{8} \text{ radians,} \tag{34}$$

we find the optimal loop gain coefficient as $$K = 16 f. \tag{35}$$

The loop gain coefficient is just the product of the loop element gain coefficients $$K = K_\phi K_f K_o$$

where
 $K_\phi$ = phase detector gain coefficient
 $K_f$ = loop filter gain coefficient
 $K_o$ = VCO control coefficient
The phase detector gain can be expressed as $$K_\phi = \frac{2\sqrt{2}}{\pi} (50 \times 10^{-3} \times 10^{C/10})^{\frac{1}{2}} \tag{37}$$

where
 C = carrier level at detector, dBm
The carrier level at the detector can be written as $$C = \frac{C}{N} + NB - B \tag{38}$$

where
 C/N = carrier to noise density ratio, db.Hz
 NB = noise power level at detector input, dbM
 B = predetection filter noise bandwidth, dB re 1 Hz
For the present system $$B = 47 \text{ dB (50 kHz)}$$

and $$NB = 2 \text{ dBm}$$

as controlled by the AGC in the preacquisition mode. The optimal filter gain K corresponds to each specified pair of C/N and f values from eq's (35)-(38).

The loop filter input resistor ($R_a$ in FIG. 2) can be determined from $$K_F = \frac{1}{R_a(C_1 + C_2 + C_3)} \tag{39}$$

Recalling that $$K_0 = 2 \times \frac{14}{15} \times 82 \times 10^3 \text{rad} \cdot \text{sec}^{-1} \text{ volt}$$

$$C_1 + C_2 + C_3 = 1.232 \ \mu F$$

we can tabulate the optimal design values as shown in Table I.

Actual values used for R are rounded to the nearest 5% standard value.

TABLE I

| | | LOOP FILTER GAINS | | | | |
|---|---|---|---|---|---|---|
| C/N | f | K | C | $K_0$ | $K_F$ | $R_a$ |
| 39 dB.Hz | 125 kHz/sec | $2 \times 10^6 \text{ sec}^{-2}$ | −6 dBm | .100 V/rad | 41.6 sec$^{-1}$ | 19.5 KΩ |
| 41 | 250 | $4 \times 10^6$ | −4 | .127 | 65.5 | 12.4 |
| 43 | 500 | $8 \times 10^6$ | −2 | .160 | 104 | 7.81 |
| 45 | 1000 | $16 \times 10^6$ | 0 | .201 | 166 | 4.90 |

As will be apparent, the principles of the invention developed above may be applied in numerous contexts and to design numerous circuits employing phase locking, one example of which has been specifically described above. Therefore it is to be understood that, within the scope of the appended claims, the invention may be practiced other than as specifically described herein.

What is claimed is:

1. In a phase lock loop including a phase detector and voltage controlled oscillator (VCO), the improvement comprising:
   a loop filter means connected between said phase detector and voltage controlled oscillator for switching between a constant phase margin filter in a carrier acquisition mode and a second order filter in a carrier tracking mode.

2. The phase lock loop of claim 1, wherein said second order filter and said constant phase margin filter share a common pole and zero.

3. The phase lock loop of claim 2 wherein the constant phase margin filter includes at least one pole and zero in addition to said common pole and zero and wherein said one pole and zero are selected to minimize the mean square deviation of a phase margin expression from a desired value over a selected frequency range.

4. The phase lock loop of claim 3 further including a predetection filter having a pole and connected between said loop filter means and said VCO wherein said phase margin expression contains a contribution from the predetection filter pole.

5. The phase lock loop of claim 4 wherein said phase margin expression further includes a contribution from at least one parasitic pole.

6. The phase lock loop of claim 5 wherein said loop is used in carrier frequency acquisition, wherein said loop filter means has a gain coefficient and wherein said gain coefficient is selected to maximize the probability of carrier acquisition at a plurality of frequencies and carrier to noise density ratios.

7. The phase lock loop of claim 6 wherein said gain coefficient is selected to yield a steady state tracking error of $\pi/8$ radians.

8. The phase lock loop of claim 6 wherein said phase margin expression includes contributions from first and second parasitic poles.

9. The phase lock loop of claim 6 wherein the selected frequency range extends from twice the frequency of said common zero to one half the frequency of the predection filter pole.

10. The phase lock loop of claim 8 wherein said first and second parasitic poles are generated by said VCO.

11. A loop filter for a phase lock loop comprising:
    first filter means exhibiting a constant phase characteristic for acquiring a carrier;
    second filter means exhibiting a second order filter characteristic for tracking the carrier; and
    means for switching from said first filter means to said second filter means upon detection of phase locking to said carrier.

12. The loop filter of claim 11 wherein said first filter means comprises:
    an operational amplifier means having an inverting input and an output;
    a first resistance connected to said inverting input; and
    a constant phase network connected in the feedback path from the output to the inverting input of said operational amplifier means.

13. The loop filter of claim 12 wherein said constant phase network comprises:
    first, second and third capacitors each having a first terminal connected to said output and a second terminal; and
    first, second and third resistors each having a first terminal connected to a second terminal of a respective one of said first, second and third capacitors and a second terminal, the second terminals of said first, second and third resistors being connected to said inverting input.

14. The loop filter of claim 13 further including a second resistance and wherein said switch means comprises means for switching said inverting input to substitute said second resistance for said first resistance and to remove said second and third capacitors and second and third resistors from said loop filter.

* * * * *